US008863050B1

(12) United States Patent
O'Riordan et al.

(10) Patent No.: US 8,863,050 B1
(45) Date of Patent: Oct. 14, 2014

(54) EFFICIENT SINGLE-RUN METHOD TO DETERMINE ANALOG FAULT COVERAGE VERSUS BRIDGE RESISTANCE

(71) Applicant: Cadence Design Systems, Inc., San Jose, CA (US)

(72) Inventors: Donald J. O'Riordan, Sunnyvale, CA (US); Victor Zhuk, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/843,139

(22) Filed: Mar. 15, 2013

(51) Int. Cl.
*G06F 17/50* (2006.01)

(52) U.S. Cl.
CPC .................................. *G06F 17/5009* (2013.01)
USPC ............................ 716/106; 716/111; 716/136

(58) Field of Classification Search
CPC ................... G01R 31/31704; G01R 31/31835; G06F 17/5045
USPC .......................................... 716/106, 111, 136
See application file for complete search history.

(56) References Cited

U.S. PATENT DOCUMENTS 4,937,765 A * 6/1990 Shupe et al. .................. 702/187
5,084,824 A 1/1992 Lam et al.
5,157,668 A 10/1992 Buenzli et al.
5,325,309 A 6/1994 Halaviati et al.
5,475,695 A 12/1995 Caywood et al.
6,009,251 A 12/1999 Ho et al.
6,035,114 A 3/2000 Tseng et al.
6,611,948 B1 8/2003 Tyler et al.
7,103,434 B2 9/2006 Chernyak et al.
7,117,471 B1 10/2006 Li et al.
7,296,249 B2 * 11/2007 Rinderknecht et al. ....... 716/106
7,472,051 B2 12/2008 Mariani et al.
7,562,321 B2 * 7/2009 Wang et al. .................. 716/136
7,716,611 B2 5/2010 Pikus et al.
2004/0060017 A1 3/2004 Abdennadher
2006/0041417 A1 2/2006 Palladino
2008/0276206 A1 11/2008 Mariani
2010/0229061 A1 9/2010 Hapke et al.
2010/0257494 A1 10/2010 Pouarz et al.
2013/0054161 A1 2/2013 Hapke et al.
2014/0059507 A1 2/2014 Sunter

OTHER PUBLICATIONS

Maidon et al., "Diagnosis of Multifaults in Analogue Circuits using Multilayer Perceptions", Jun. 1997, IEE, Proceedings on Circuits Devices & Systems, vol. 144, iss 3, pp. 149-154.*

(Continued)

*Primary Examiner* — Sun Lin
(74) *Attorney, Agent, or Firm* — Kenyon & Kenyon LLP

(57) ABSTRACT

In a system, method, and computer program product for analyzing faults in a circuit design, variation of analog fault coverage as a function of bridge resistance values is computed in a single simulation run. A simulator stores intermediate circuit states for each fault resistance value, and performs short interval simulations that may re-use intermediate states as initial solution estimates for simulation of the next fault resistance value. Initial fault resistance values are reduced during simulation passes to aid simulator convergence. The selected evaluation order of test points, faults, and fault resistance values reduces computational and storage costs. Embodiments enable test engineers to rapidly understand if analog defect tests are only sufficient for identifying defects of a certain type and/or value, and to determine fault coverage variability over a full process space.

32 Claims, 11 Drawing Sheets

START
FOR EACH TEST POINT: 802
COMPUTE THE FAULT-FREE CIRCUIT RESPONSE TO CURRENT TEST POINT 804
SAVE RESULTS FOR AT LEAST THE FAULT INJECTION POINT AND TEST POINT 806
FOR EACH FAULT: 808
INSERT THE FAULT 810
FOR EACH FAULT RESISTANCE VALUE: 812
SET THE INITIAL CONDITION TO THE CORRESPONDING FAULT-FREE CIRCUIT SOLUTION OR THE PRIOR SOLUTION 814
REDUCE FAULT RESISTANCE VALUE FROM AN ARBITRARILY LARGE VALUE OR THE PRIOR VALUE TO THE CURRENT VALUE 816
SIMULATE FROM EACH FAULT INJECTION POINT OR THE PREVIOUS SOLUTION POINT TO THE CORRESPONDING TEST POINT AND SAVE RESULTS 818
END

(56) References Cited

OTHER PUBLICATIONS

Liobe et al. "Non-Intrusive Testing Methodology for CMOS RF LNAs", Jun. 2005, IEEE, Radio Frequency Integrated Circuits Symposium, Digest of Papers, pp. 653-656.*

Piet Engelke—"Resistive Bridging Fault Simulation of Industrial Circuits", Design, Automation and Test in Europe, p. 628-633, 2008.

Yuyun Liao & D.M.H. Walker—"Fault Coverage Analysis for Physically-Based CMOS Bridging Faults at Different Power Supply Voltages", Proceedings, 1996 International Test Conference, p. 767-775, 1996.

R. Rodriguez-Montanes, E.M.J.G. Bruls*, J. Figueras—"Bridging Defects Resistance Measurements in a CMOS Process", Proceedings, 1992 International Test Conference, p. 892-898, 1992.

Vijay R. Sar-Dessai & D.M.H. Walker—"Resistive Bridge Fault Modeling, Simulation and Test Generation", Proceedings, 1999 International Test Conference, p. 596-605, 1999.

Bram Kruseman, Bratislav Tasic, Camelia Hora, Jos Dohmen, Hamidreza Hashempour, Maikel Van Beurden, Yizi Xing—"Defect Oriented Testing for Analog/Mixed-Signal Devices", 2011 IEEE International Test Conference, p. 1-10, 2011.

Mei, Kenyon C.Y., "Bridging and Stuck-At Faults," IEEE Transaction on Computers, vol. c-23, No. 7, Jul. 1974, pp. 720-727.

Ferguson, F. Joel, et al., "Test Pattern Generation for Realistic Bridge Faults in CMOS ICs," IEEE International Test Conference, Oct. 1991, pp. 492-499.

Spinner, Stefan, et al., "Automatic Test Pattern Generation for Interconnect Open Defects," 26th IEEE VLSI Test Symposium, Apr. 2008, pp. 181-186.

Waicukauski, John A., et al., "Transition Fault Simulation," IEEE Design & Test of Computers, Apr. 1987, pp. 32-38.

Pomeranz, Irith, et al., "On n-Detection Test Sets and Variable n-Detection Test Sets for Transition Faults," in Proc. of VTS, Apr. 1999, pp. 173-180.

Geuzebroek, Jeroen, et al., "Embedded Multi-Detect ATPG and Its Effect on the Detection of Unmodeled Defects," IEEE ITC, Oct. 2007, paper 30.3, pp. 1-10.

Cho, Kyoung Youn, et al., "Gate Exhaustive Testing," IEEE, ITC, paper 31.3, Nov. 2005, pp. 1-7.

Hapke, F., et al.. "Defect-Oriented Cell-Aware ATPG and Fault Simulation for Industrial Cell Libraries and Designs," IEEE ITC, Nov. 2009, paper 1.2, pp. 1-10.

Hapke, F., et al., "Cell-Aware Production Test Results From a 32-nm Notebook Processor," IEEE ITC, Nov. 2012. paper 1.1, pp. 1-9.

* cited by examiner

V(t)
time
tstart
TP1
TP2
200
202
204
206
208
210
212
214
216
218
224
226
228

V(t)
time
tstart
TP1
TP2
200
208
210
212
302
304
306
314
316
318
324
326
328

V(t)
time
tstart
TP1
TP2
200
202
204
206
208
210
212
214
216
218
224
226
228
402
404
406
408
410
412
414
410B
412B
414B V(t)
time
tstart
TP1
TP2
200
210
212
208
302
304
306
314
316
318
324
326
328
402
404
406
408
510
512
514
510B
512B
514B V(t)
time
tstart
TP1
200
210
406
402
208
702
704
706
710
712
714
716
718
750
752
754

1000
1004
MEMORY
ROM
BIOS
RAM
OPERATING SYSTEM
APPLICATION PROGRAMS
PROGRAM DATA
1002
CPU
SYSTEM BUS
1006
1014
VIDEO INTERFACE
1018
OUTPUT PERIPHERAL INTERFACE
1008
EXTERNAL MEMORY INTERFACE
1010
INPUT INTERFACE
1012
NETWORK INTERFACE
TO DVD
TO CD-ROM
TO MOUSE
TO KEYBOARD
TO LAN
1016
MONITOR
PRINTER
1020

EFFICIENT SINGLE-RUN METHOD TO DETERMINE ANALOG FAULT COVERAGE VERSUS BRIDGE RESISTANCE

CROSS REFERENCE TO RELATED APPLICATIONS

The present application is related to U.S. application Ser. No. 13/683,810, entitled "System And Method For Fault Sensitivity Analysis Of Mixed-Signal Integrated Circuit Designs", filed on Nov. 21, 2012. This related application is hereby incorporated by reference in its entirety.

The present application is related to U.S. application Ser. No. 13/683,853, entitled "System And Method For Fault Sensitivity Analysis Of Digitally-Calibrated-Circuit Designs", filed on Nov. 21, 2012. This related application is hereby incorporated by reference in its entirety.

The present application is related to U.S. application Ser. No. 13/683,889, entitled "Analog Fault Visualization System And Method For Circuit Designs", filed on Nov. 21, 2012. This related application is hereby incorporated by reference in its entirety.

BACKGROUND

Resistive bridges are a major class of defects in nanometer technologies that can escape testing, posing a serious reliability risk for CMOS integrated circuits. The bridges generally result from undesired materials forming extraneous electrical connections in a circuit. FIG. 1 shows a distribution fit to the bridge resistance data for a typical fabrication process, where Rb is the bridging resistance and P(Rb) is the cumulative probability. This plot indicates that a substantial portion of bridge failures have a significant resistance (e.g., greater than 500 Ohms).

It is also known that as the power supply voltage Vdd is decreased, higher bridging resistances may be detected. In other words, faults that escape detection at higher values of Vdd may be detected when Vdd is dropped (i.e., fault coverage increases). Combined, these facts indicate that previous naïve assumptions of zero-Ohm bridge resistance models are insufficient for accurately determining bridge fault coverage. While this inaccuracy has been known and tolerated for some time in the digital fault simulation arena, it is less tolerable in the analog fault simulation arena. In analog circuitry, even small changes in a bridge resistance can make a big difference in its effect on the analog circuit behavior and thus in fault coverage.

More attention is therefore now being paid to resistive bridging, as shown by the emergence of resistive bridging fault simulators. These simulators focus on determining analog detectability intervals, which are the ranges of bridge resistances for which a given test pattern can detect a given fault.

At least one commercially available simulator tool provides an Analog Fault Sensitivity Analysis (AFSA), which is a technique for primarily establishing the detection status of defects. AFSA allows very efficient analog defect simulation with reasonable accuracy for transient analysis in nonlinear circuits. (Simulation generally includes mathematically applying selected stimuli to a circuit representation, and computing and outputting resultant circuit responses of interest, as is well understood in the art.) ASFA achieves much of its performance gain by simulating the presence of the analog faults only during short "refine time" intervals preceding the various test/measurement time points. For the remaining longer time intervals in between the test points, the fault-free or "golden" simulation waveforms and circuit states are re-used. This method generally succeeds when the fault-free solution to the circuit equations is reasonably close to the fault-in-place solution. (Note, the term "fault-free" simulation is a relative term. As a practical matter, there may be faults in a "fault-free" simulation, but the ordinarily skilled artisan will understand that the number of faults is small, and that the faults would not affect the overall operation of the simulation with respect to the relevant outputs that are the subject of the comparison.)

However, this simulator tool currently uses a single user-specifiable bridge resistance value per fault. As such, the tool is also somewhat naïve, and its fault coverage determination may suffer accordingly. It is however possible to determine analog circuit fault coverage versus bridge resistance value at the user level by performing multiple AFSA runs. A different bridge resistance parameter value would be specified for each simulation run.

FIG. 2 shows the results of such a brute force simulation performed for a given fault, called Fault 1. The simulation uses three different exemplary bridge resistance values, e.g., 1000 Ohms, 100 Ohms, and 10 Ohms, which represent a sampling of the known bridge resistance distribution of FIG. 1. Trace 200 corresponds to the fault-free circuit response, depicting a particular node voltage waveform of interest as a function of time, with voltages 210 and 212 occurring at times TP1 and TP2, respectively. The other traces (202, 204, and 206) show the circuit voltage response in the presence of the fault with each of the three different fault resistance values. For example, response 202 is the result for Fault 1 having a resistance of 1000 Ohms, response 204 is the result for Fault 1 having a resistance of 100 Ohms, and response 206 is the result for Fault 1 having a resistance of 10 Ohms. Typically, the circuit responses for various resistance values need to be determined at various specified test point times, such as TP1 (voltages 214, 216, and 218) and TP2 (voltages 224, 226, and 228) as shown. The simulation may begin at tstart, a selected start time (not necessarily zero).

FIG. 3 depicts the results of repeating the simulation for a second fault, called Fault 2. In this case, the simulator may determine three additional trajectories as shown in traces 302, 304, and 306. These traces show the circuit response in the presence of Fault 2 with the same three fault resistance values of 1000, 100, and 10 Ohms as before. Voltages 314, 316, and 318 occur at TP1 for the various resistance values, and voltages 324, 326, and 328 occur at TP2. Fault 2's circuit responses appear to be closer to the fault-free circuit response 200 when compared with the circuit responses with Fault 1. For example, at time point TP2, voltage 324 resulting from the 1000 ohm fault is essentially the same as fault-free voltage 212. The circuit operation is thus somewhat more tolerant of a resistive bridge with Fault 2, making fault detection more difficult for Fault 2.

A simulator or post-processing tool may "detect" faults in many different ways. In general, detection of a fault may involve performing various mathematical operations and transformations on circuit quantities to compute performance values, and comparing the computed performance values against expected values. For example, a fault may be detected if it causes a circuit node voltage or current to deviate from a fault-free voltage or current excessively. Faults may also be detected by comparing more involved circuit performance quantities, such as the frequency of a voltage or current oscillation. Alternatively, a detection voltage threshold or current threshold or a frequency range may be set, and comparisons made to detect faults. The comparisons may be simple comparisons with a threshold, or more complex comparisons such as whether values fit within a range. The range itself may even vary as a function of the test point. The specifics of the comparison may be circuit/application specific, and may vary from one type of circuit to the next.

In a simple example, the simulator may set or compute a detection threshold voltage, e.g. voltage 208, for use as a comparison. The detection threshold voltage may be related to the voltage required to cause a circuit malfunction. If a fault is considered "detected" for any value of the voltage response waveform below the detection threshold 208 shown for TP1 for example, then Fault 1 of FIG. 2 would be detected for all three fault values. However, Fault 2 of FIG. 3 would only be detected for the 100 Ohm and 10 Ohm cases. Fault 2 would not be detected at the 1000 Ohm case as its TP1 voltage value 314 is above the detection threshold value 208.

This analysis approach requires significant simulation time, which increases linearly with the number of runs (i.e., the number of different bridge resistance parameter values of interest), in order to represent a sufficient sampling of the range of resistance values known to occur. Since analog fault simulations are already notoriously slow, even with the efficiencies introduced by the AFSA technique, this multiple simulation approach to sample the resistive bridge values is prohibitive in terms of both CPU usage and disk usage. Therefore the circuit design industry requires a method to more efficiently calculate analog circuit responses and corresponding fault coverage in the face of multiple bridge resistance parameter values. Accordingly, the inventors have developed an efficient single-run method to determine analog fault coverage versus bridge resistance.

DETAILED DESCRIPTION

This application presents a highly efficient method by which the variation of analog fault coverage as a function of bridge resistance values may be computed in a single simulation run. This method may allow analog test engineers to rapidly understand if analog defect tests are only sufficient for identifying defects of a certain type and/or value, and to determine fault coverage variability over the full process space.

The single run approach to the problem may minimize redundancy and maximize throughput. The approach may involve the simulator storing and retrieving intermediate circuit states on a per-fault-resistance basis, and only performing short interval simulations for each selected fault resistance value in decreasing resistance order. The single run approach may thus effectively re-use those intermediate circuit states in a very simulation-efficient manner. The result may be increased speed and minimal usage of computing resources to determine analog fault coverage over the bridge resistance space.

Figure 3:
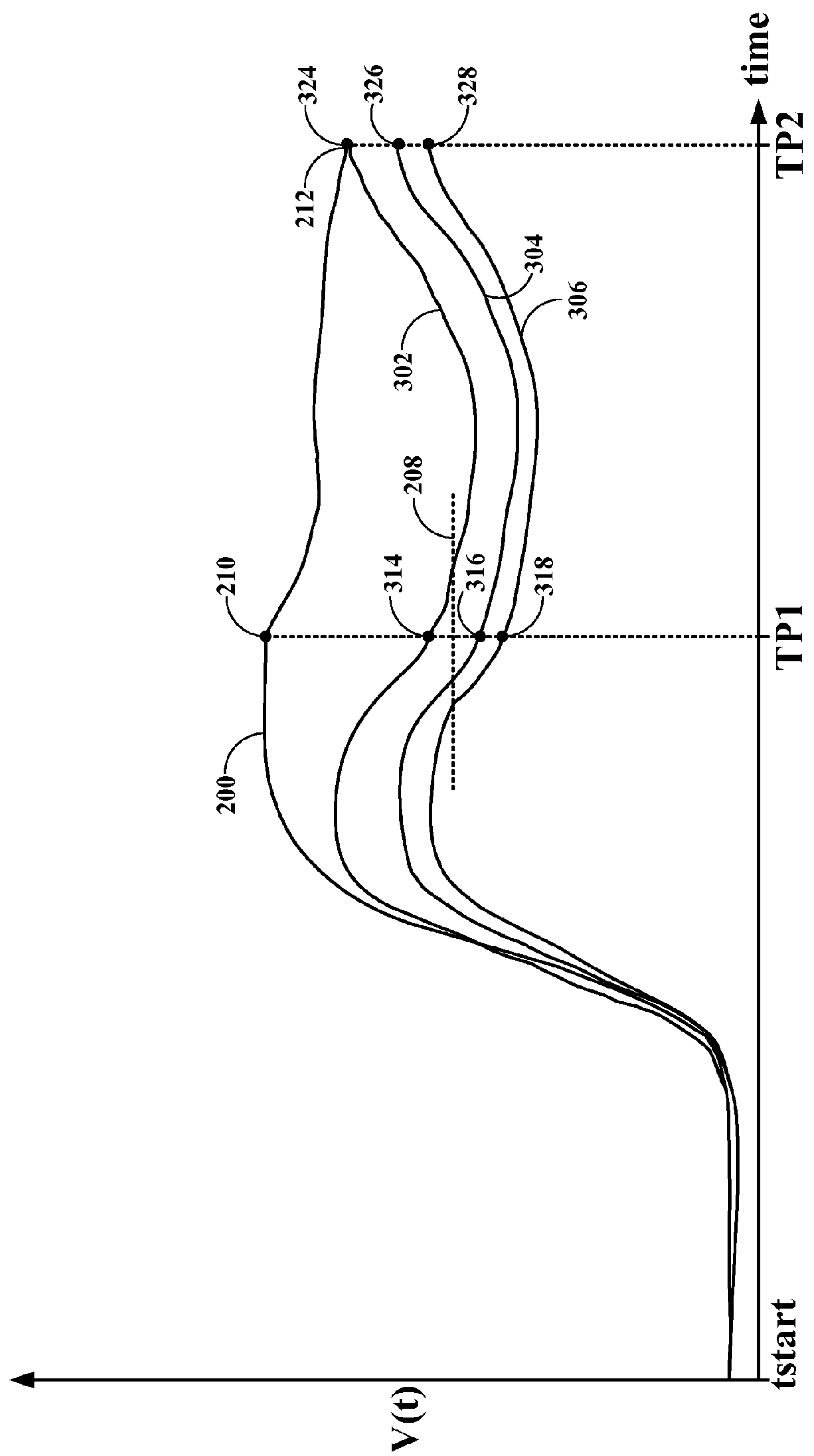
FIG. 3 is a diagram of exemplary circuit response waveforms versus time for the circuit with a second fault having the three exemplary bridge resistance values.
Figure 4:
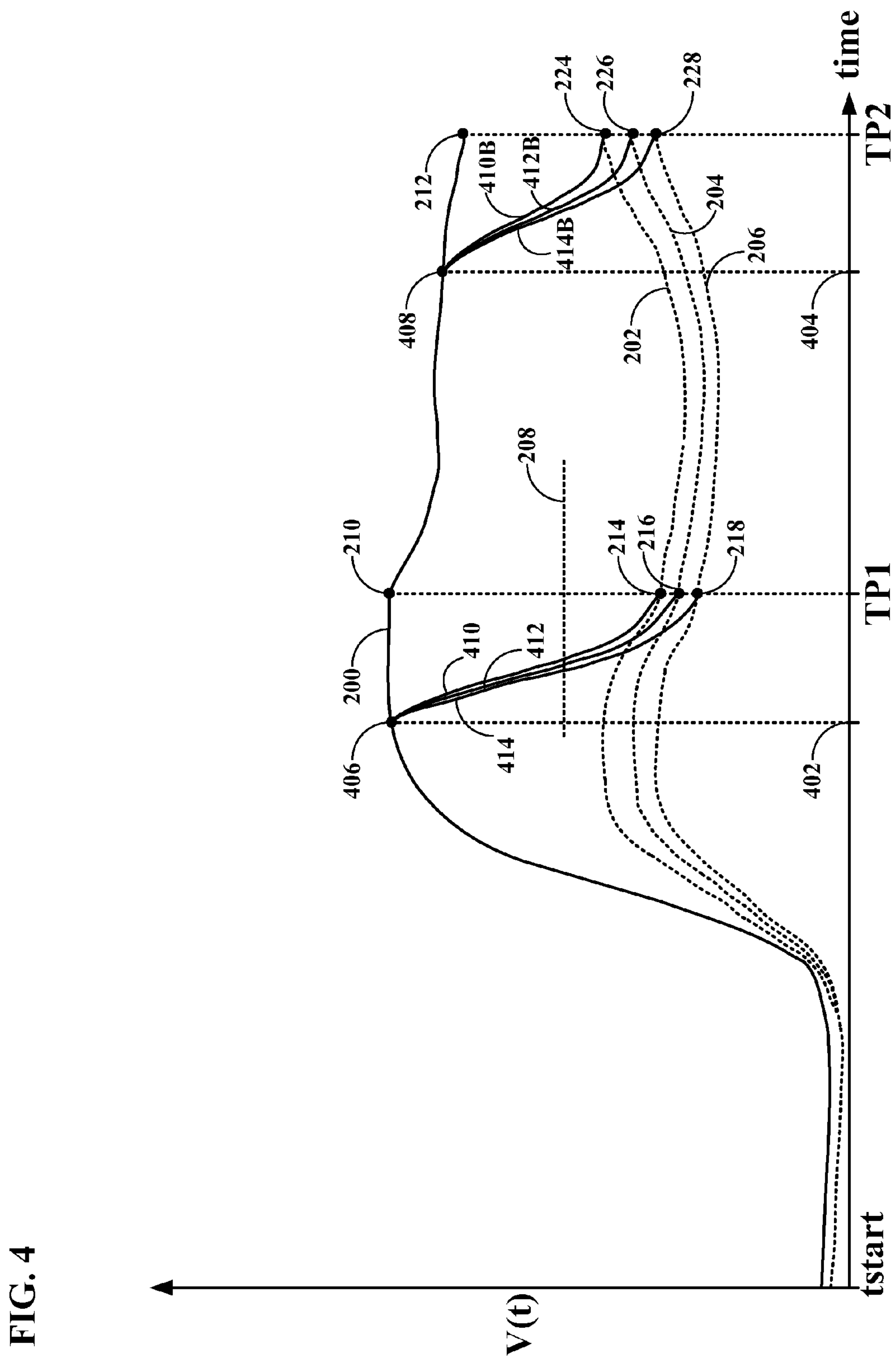
FIG. 4 is a diagram of circuit response waveforms versus time for a fault-free circuit, and for the same circuit with a first fault having three different exemplary bridge resistance values, according to an embodiment.
Figure 5:
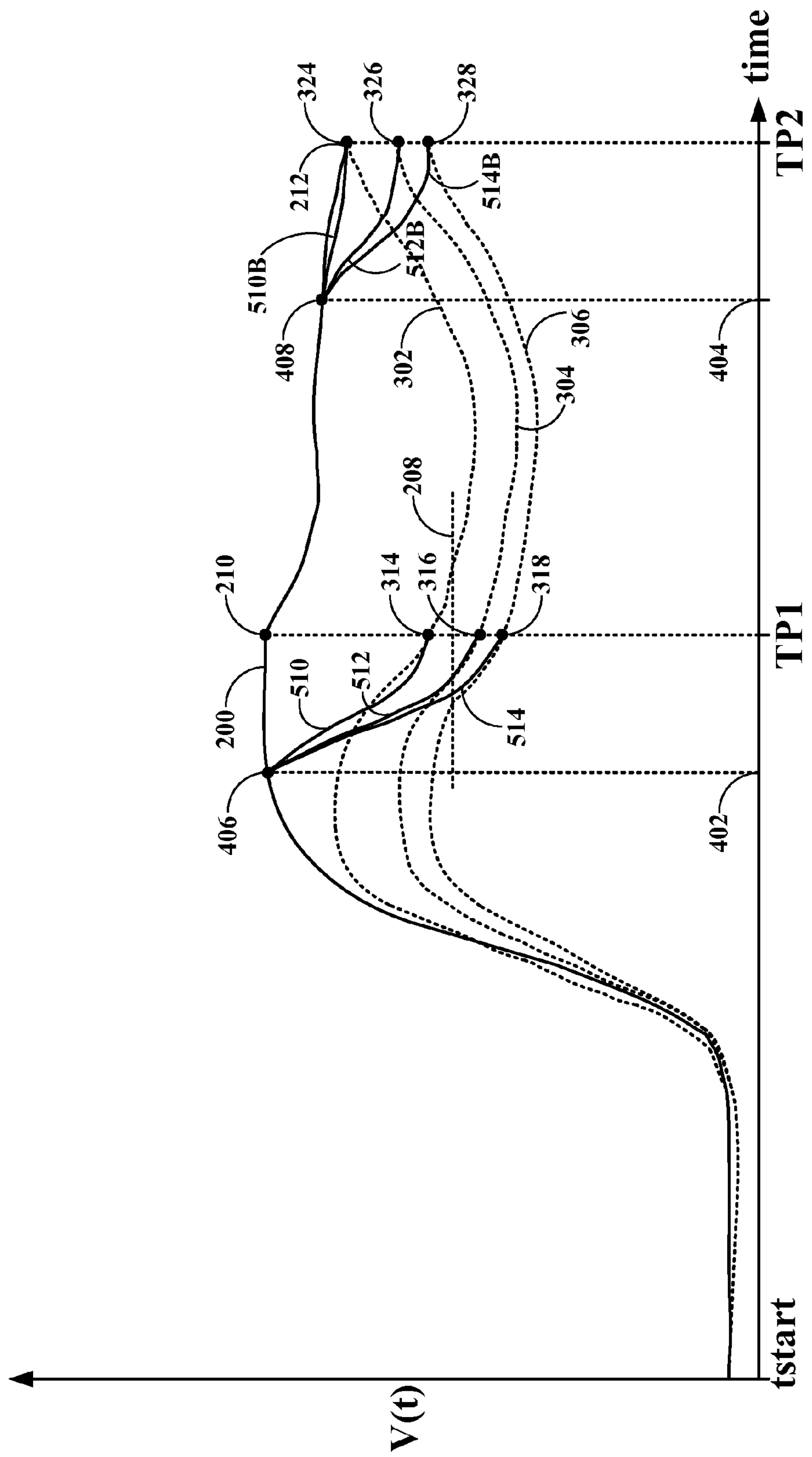
FIG. 5 is a diagram of circuit response waveforms versus time for the circuit with a second fault having the three exemplary bridge resistance values, according to an embodiment.

First, an initial embodiment providing a multiple-run improvement on the multiple user-run simulation scheme described above regarding FIG. 2 and FIG. 3 is provided. FIG. 4 and FIG. 5 indicate how Fault 1 and Fault 2 respectively might be identified as detectable (with the same 1000 Ohm exception case as before) if using the ASFA algorithm, where the user may perform multiple runs as described above. That is, the user may run three AFSA simulations, one for each of the three fault resistance values 1000 Ohms, 100 Ohms, and 10 Ohms. The stimuli applied to the circuit and/or the responses of interest may be selected by a user. The stimuli are generally independent of the faults, so the same stimuli may be applied in the fault-free case as are applied to the fault-inclusive cases.

Figure 1:
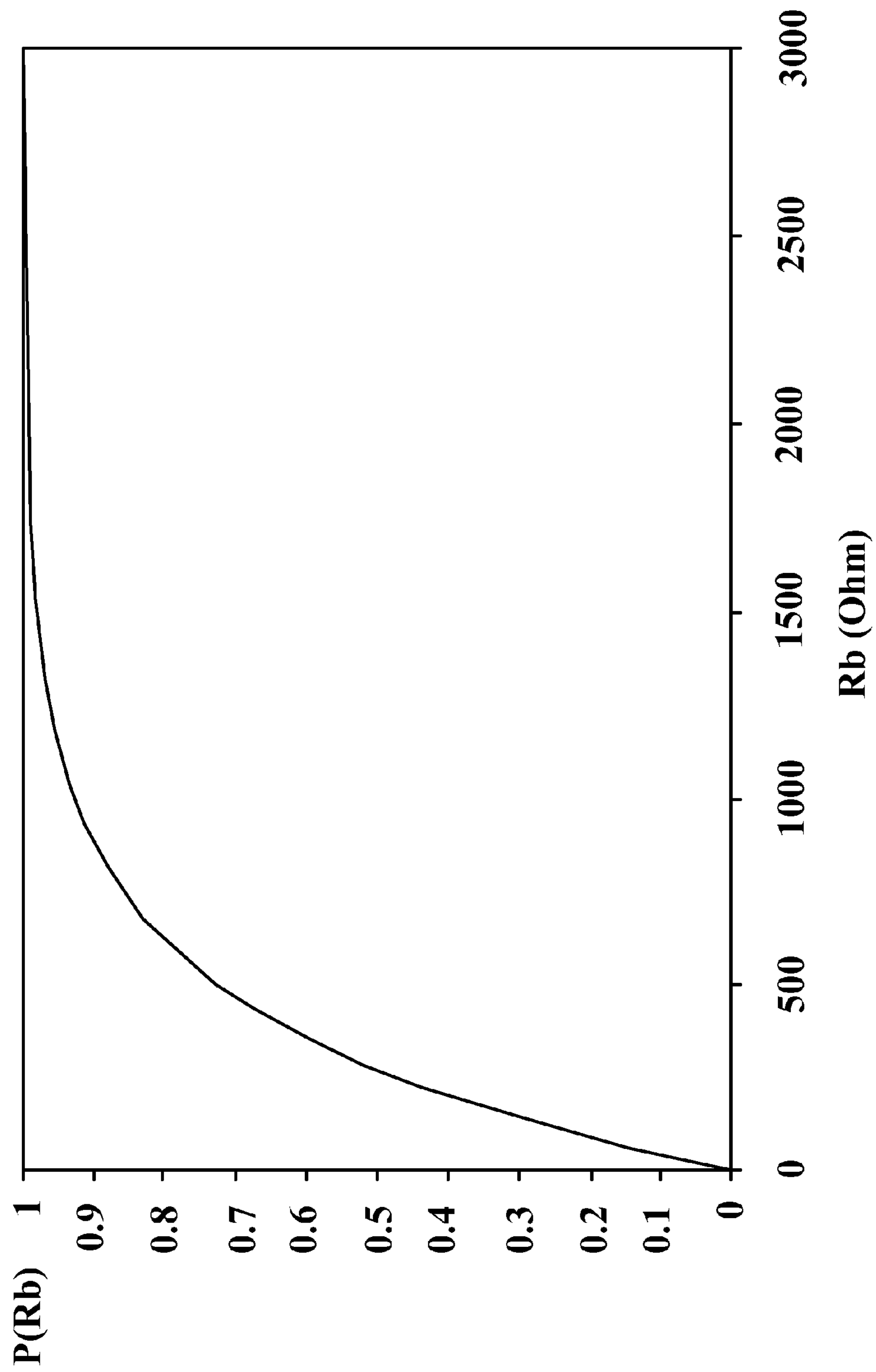
FIG. 1 is a graph of an exemplary cumulative probability distribution for various bridge resistance values.
Figure 2:
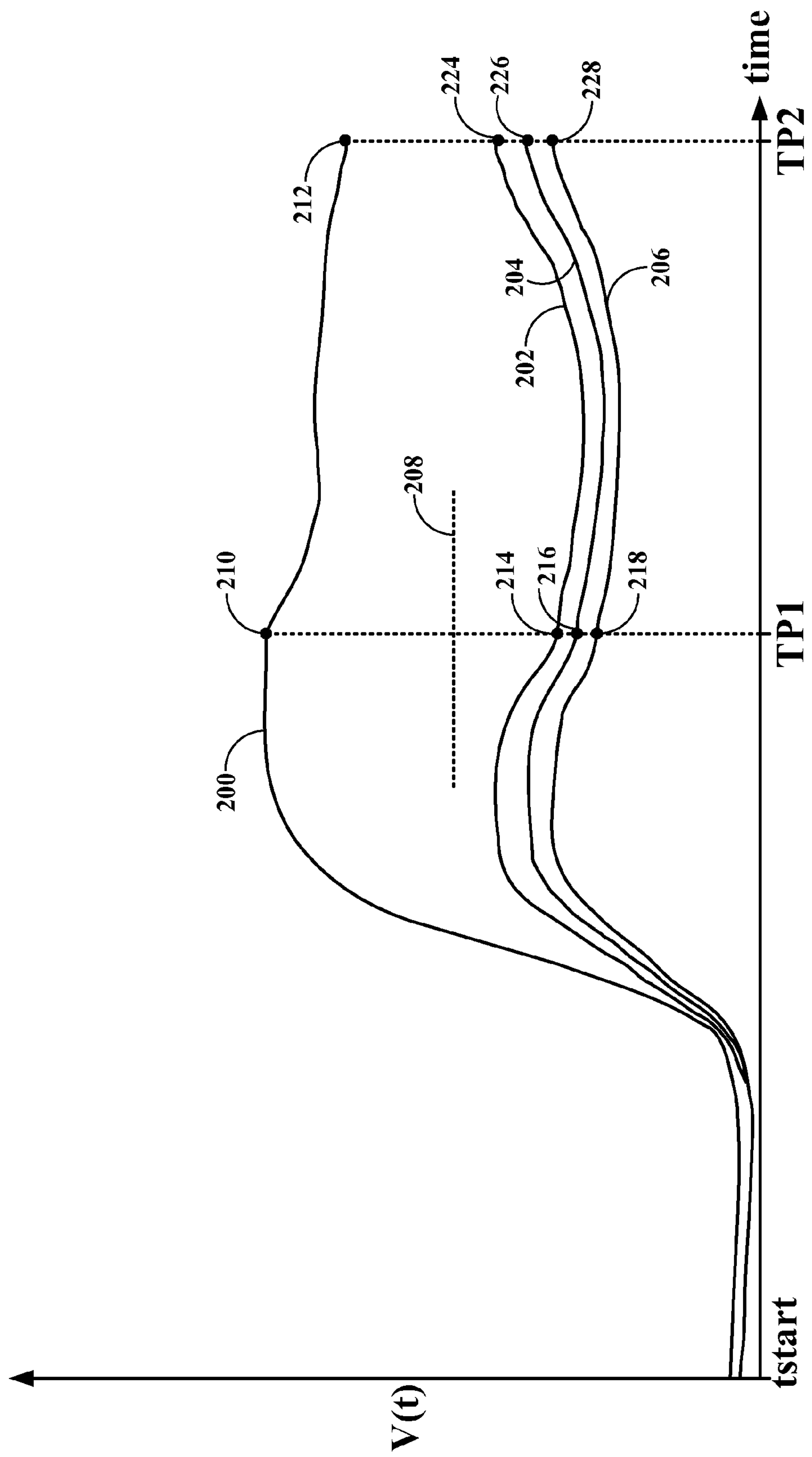
FIG. 2 is a diagram of exemplary circuit response waveforms versus time for a fault-free circuit, and for the same circuit with a first fault having three different exemplary bridge resistance values.

In this embodiment, for each bridge resistance value, the simulator may first simulate the fault-free circuit to determine the circuit voltages at each of the fault injection points (e.g., 402, 404), which may begin some time before a given test point (e.g., TP1, TP2). The interval between a fault injection point and a corresponding test point may be user-selectable. The fault injection points may also coincide directly with the corresponding test points, so the interval between a fault injection point and its corresponding test point may be zero. The simulator may store the fault-free circuit state at each of those fault injection points (e.g., voltages 406 and 408). The simulator may store information in a memory, a disk drive, or a database, with information available in electronic, displayed, or printed form for example. For each of the faults (of which there may be thousands), the simulator may then inject each of the faults in turn at the fault injection points. The simulator may then simulate each fault only for certain short time spans from the fault injection point (e.g., 402) to the corresponding test point (e.g., TP1), using the stored fault-free circuit state (e.g., waveform point 406) as its initial condition. Note, the traces 202, 204, and 206 that would result from a full simulation of the circuit for each fault resistance value as previously described in FIG. 2 are shown in dashed lines for reference, but such a full simulation need not be performed in this embodiment.

Thus, fault-in-place circuits need only be simulated during a number of brief fault injection periods, e.g., from time 402 to TP1 and from time 404 to TP2, etc. The simulator may use the fault-free solution 406 as the initial condition at time 402, and may perform a transient analysis with a particular fault resistance value in place up to TP1 to determine the simulation results at TP1. FIG. 4 shows how this would appear for the three different bridge resistor values, (each simulated in a different run) for one single fault, Fault 1, resulting in traces 410, 412, and 414. The simulator may then use the fault-free solution 408 as the initial condition at time 404, and perform a transient analysis with the particular fault resistance value in place up to TP2 to determine the results at TP2. FIG. 4 shows the resulting traces as 410B, 412B, and 414B.

FIG. 5 shows similar trajectories (510, 512, 514 for TP1, and 510B, 512B, and 514B for TP2) for a second fault, Fault 2, simulated in multiple runs, with each run using one of the selected resistance values. Note, the traces 302, 304, and 306 that would result from a full simulation of the circuit for each fault resistance value as previously described in FIG. 3 are again shown in dashed lines for reference, but such a full simulation again need not be performed. The embodiment thus may perform a simulation run for all fault injection periods up to each test point for each required fault using a given fault resistance value, and then perform another similar simulation run for the next required fault resistance value.

With this modified multiple-run AFSA approach, the trajectories for Fault 1 and Fault 2 at 1000 Ohms may both be computed by the first simulation run (i.e., trajectories 410 and 410B in FIG. 4 and trajectories 510 and 510B in FIG. 5). The trajectories for Fault 1 and Fault 2 at 100 Ohms may be computed in the second run (i.e., trajectories 412 and 412B in FIG. 4 and trajectories 512 and 512B in FIG. 5). The trajectories for Fault 1 and Fault 2 at 10 Ohms may be computed in the third run (i.e. trajectories 414 and 414B in FIG. 4 and trajectories 514 and 514B in FIG. 5). Other fault resistance value simulation orderings are also possible.

While some time savings may be had by running the individual faults successively for each single fault resistance value, each of the three separate runs may also perform the full fault-free simulation run, which is identical in all resistive bridge value cases. The fault-free simulation would therefore be very redundant, i.e., wasteful of computing resources.

Figure 6A:
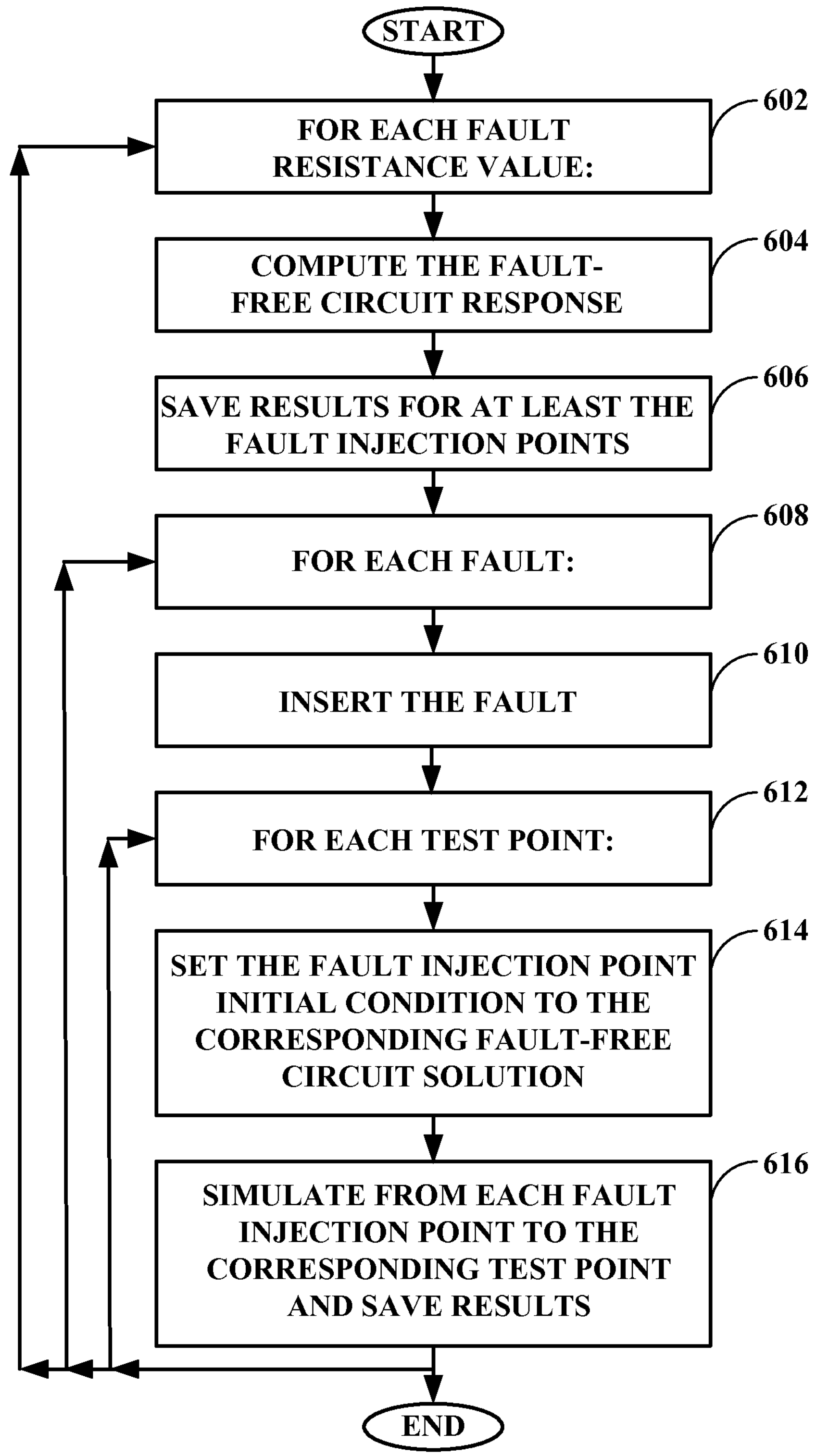
FIG. 6A is a flowchart of an analog fault simulation method, according to the embodiment of FIG. 4 and FIG. 5.

FIG. 6A is a flowchart depicting the multiple-run simulation method according to the embodiment of FIG. 4 and FIG. 5. An outer loop may be started at 602 over all fault resistance values to be evaluated. At 604, the simulator may compute the fault-free circuit response, and at 606 may store the simulation results for at least the fault injection points. The method may start a second loop within the outer loop at 608 over all faults to be evaluated. At 610, the simulator may insert the particular fault being evaluated into the circuit. The method may start a final inner loop at 612 over all test points to be evaluated. At 614, the simulator may set the initial condition of the fault injection point for the test point being evaluated according to the corresponding fault-free circuit solution computed and stored earlier. At 616, the simulator may simulate the circuit with the current fault from each fault injection point to the corresponding test point, and store the results.

The embodiment thus iterates over all test points required, for all faults required, and for each fault resistance value required, in that order, with fault resistance value changes each generally requiring a new simulator run. The simulator or a post-processing tool may compute fault coverage following completion of each or all the simulation runs. A comparison of simulation results at each test point with detection criteria may determine fault coverage as previously described, though other detection methods are also within the scope of the inventive embodiments.

Figure 6B:
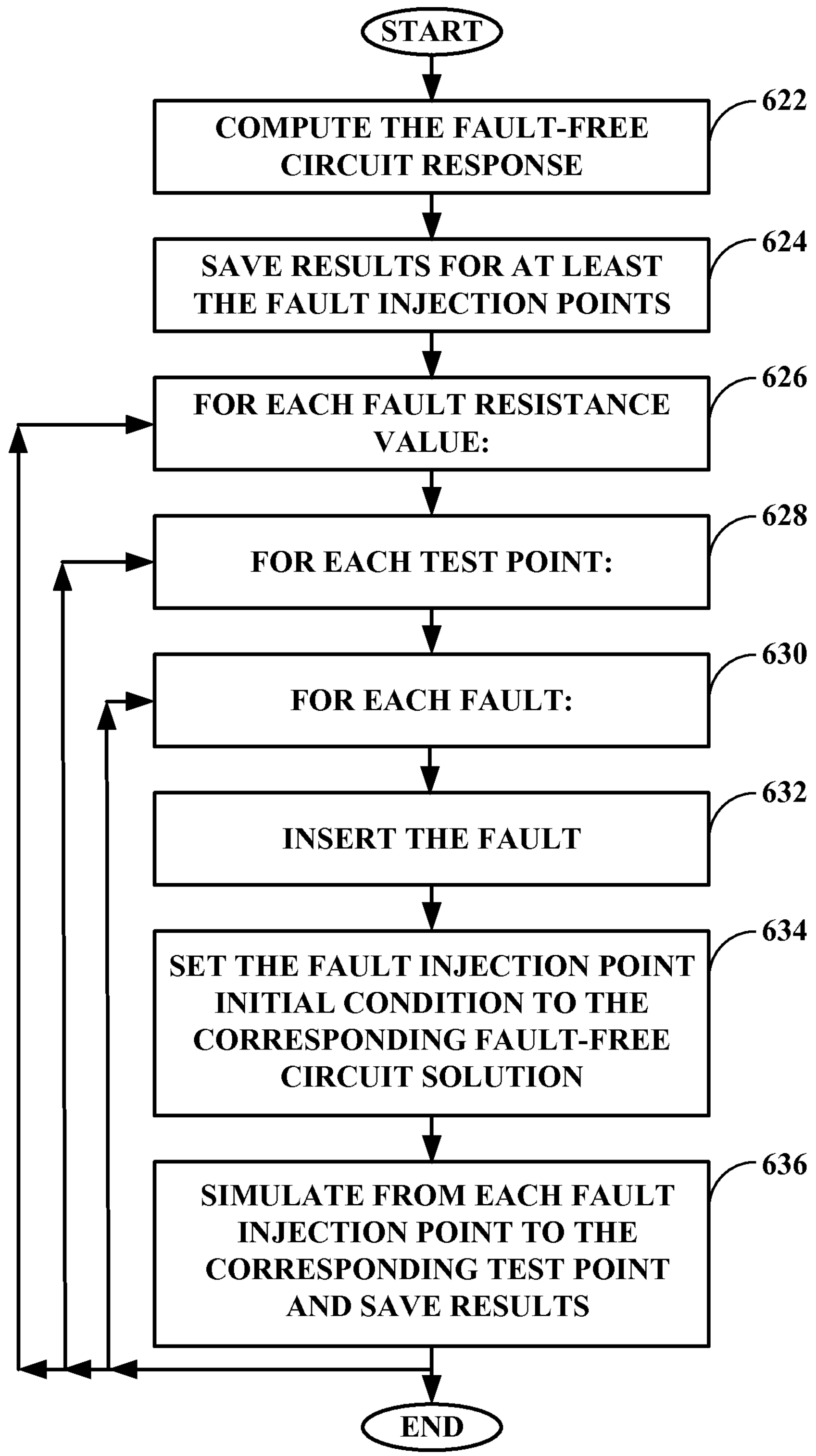
FIG. 6B is a flowchart of another analog fault simulation method, according to an embodiment.

FIG. 6B is a flowchart depicting a different multiple-run simulation method according to another similar embodiment. In this embodiment, the fault-free circuit response computation may be moved out of the simulation loops as shown at 622, to decrease computational expense. (A similar modification to the embodiment of FIG. 6A is also within the scope of the invention.) As previously described regarding FIG. 6A, at 624 the simulator may again save the fault-free circuit simulation results for at least the fault injection points. The simulator may start an outer loop at 626, over all fault resistance values to be evaluated. At 628 a second loop may start within the outer loop, but in this embodiment the second loop proceeds over all test points to be evaluated. A final inner loop may start at 630, but in this embodiment the final loop proceeds over all faults to be evaluated. At 632 the simulator may inject the current fault, and at 634 the simulator may set the initial condition of the fault injection point for the test point being evaluated according to the corresponding fault-free circuit solution computed and stored earlier. At 636, the simulator may simulate the circuit with the current fault from each fault injection point to the corresponding test point, and store the results.

This embodiment thus iterates over all faults required, for all test points required, and for each fault resistance value required, in that order, with fault resistance value changes each generally requiring a new simulator run. The simulator or a post-processing tool may compute fault coverage following completion of each or all the simulation runs. A comparison of simulation results at each test point with detection criteria may determine fault coverage as previously described, though other detection methods are also within the scope of the inventive embodiments.

Figure 7:
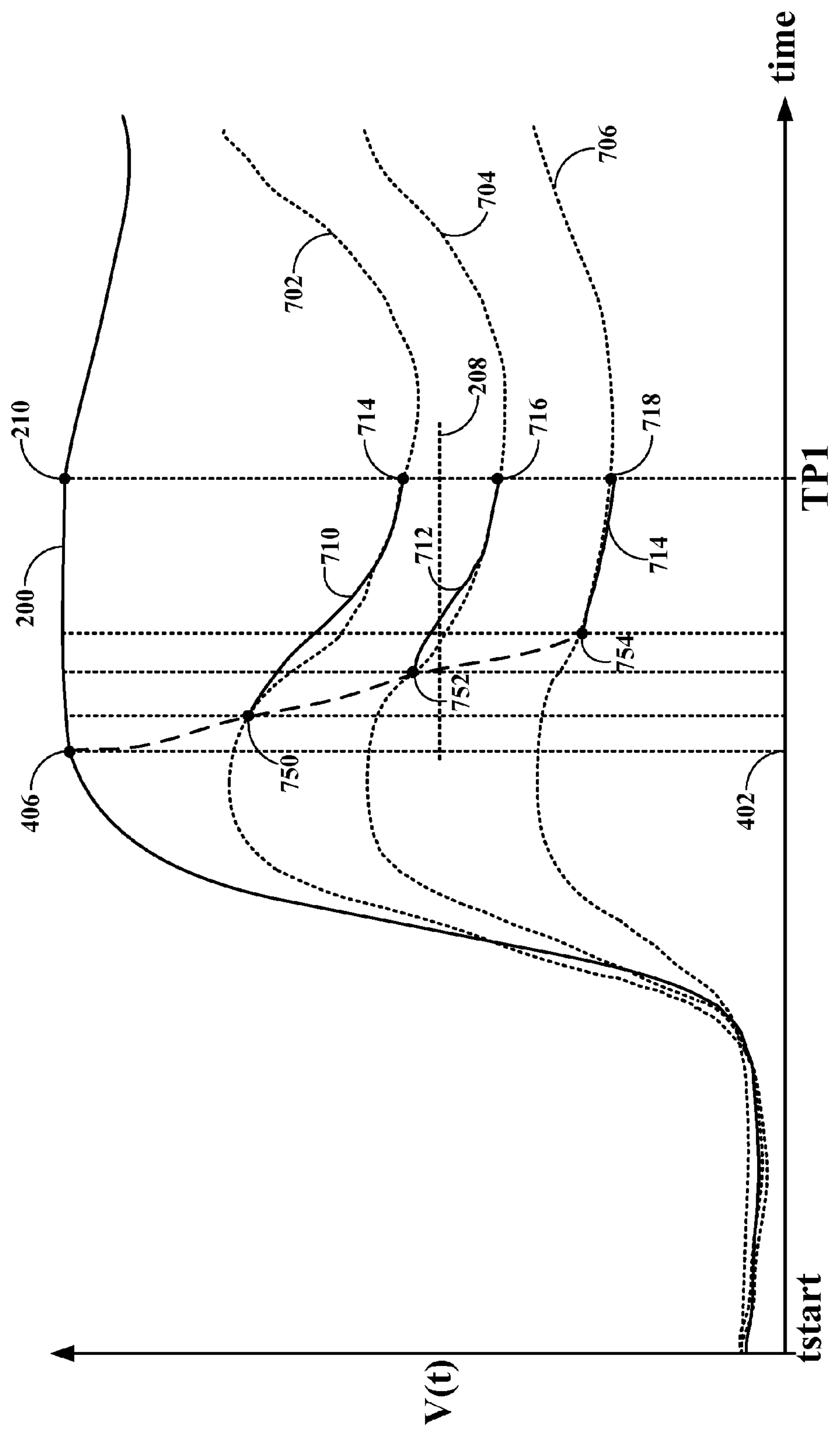
FIG. 7 is a diagram of circuit response waveforms versus time for a fault-free circuit, and for the same circuit with a fault having three different exemplary bridge resistance values, according to another embodiment.

Referring now to FIG. 7, the inventive approach taken in another embodiment is shown. This embodiment may produce results more efficiently than the solutions previously described. FIG. 7 illustrates circuit response waveforms versus time for a fault-free circuit, and for the same circuit with a fault having three different exemplary bridge resistance values. This embodiment may make the simulator aware of each of the various sampled bridge resistance values and circuit states resulting from each, in a single run. Note, the traces 702, 704, and 706 that would result from a full simulation of the circuit for each fault resistance value as previously described in are shown in dashed lines for reference, but such a full simulation again need not be performed in this embodiment.

FIG. 7 depicts a zoomed-in portion of the waveforms spanning the first fault injection interval (e.g., time point 402 to TP1), for clarity. Note, the interval from the first fault injection point to the first test point is non-zero as depicted, but it is possible the fault injection points and test points are coincident. The simulator may begin by simulating the fault-free circuit once, from tstart up to TP1, including voltage 406 occurring at fault injection point 402, and voltage 210 occurring at TP1. The simulator may store the fault-free circuit simulation results for at least the first fault injection point 402 and test point TP1.

The simulator may then inject a new fault, termed Fault 3, with an arbitrarily large (e.g., 1 GOhm) resistance value, which is still essentially an open circuit. The simulator may then solve trajectory 406 to 750 by gradually reducing the fault resistance from the large 1 GOhm initial value to the first sampled fault resistance value (e.g., 1000 Ohms). The simulator may use fault-free circuit simulation results 406 at the fault injection point 402 as an initial condition. By point 750, the bridge resistor would now be in place in the circuit, with a 1000 Ohm value. The simulator may then store the circuit simulation results at point 750, which it may re-use later.

The simulator may proceed to solve trajectory 710, to determine solution 714 at TP1 for the first bridge resistance value, 1000 Ohms. This circuit solution may be outputted, e.g. to an output database. Note that simulation trajectory 710 may not precisely match trajectory 702 that another embodiment might compute. Point 750 may be slightly advanced in time compared with time point 402 to allow the simulator to settle, but trajectory 710 will arrive substantially at voltage 714 at TP1. Note, the interval from fault injection point 402 to time point 750 is depicted as non-zero to denote that a timestep size set by a user or determined by the simulator may be used. This interval may be zero, however.

Rather than proceeding to the next fault injection point for additional simulation with the same fault resistance value, in this embodiment the simulator may instead rewind the simulation time back to the time at point 750, and restore the previously stored simulated circuit state of point 750. The simulator may then compute simulation trajectory 750-752, over which it may gradually reduce the fault bridge resistance from the current fault resistance value to the next required fault resistance value (e.g., from 1000 Ohms to 100 Ohms). This simulation will typically evaluate very quickly, as the previously stored state of point 750 is often a very good estimate of the actual solution 752, due to the relatively small resistance value changes. The Newton-Raphson algorithm commonly used in circuit simulators tends to converge very quickly when the initial guess is sufficiently close to the final solution, as is well known in the art. At point 752, the fault would be in place with the new fault resistance value (e.g., 100 Ohms), and the simulator may again store the simulation state at this point 752 for later re-use. Note, the interval from time point 750 to time point 752 is depicted as non-zero to denote that a timestep size set by a user or determined by the simulator may be used. This interval may be zero, however.

The simulator may then continue with trajectory 712 to determine the circuit response 716 at TP1 with the 100 Ohm bridge resistance value for Fault 3. The circuit solution 716 at TP1 may again be outputted, e.g., to the output database. The simulator may then rewind to the time of the 752 state, set the corresponding now-known initial conditions, and simulate trajectory 752-754, over which it may again gradually reduce the resistance from 100 Ohms to 10 Ohms. At point 754, the 10 Ohm bridge resistor would be fully in place in the correct location. The simulator may then evaluate the circuit response over trajectory 714, at which point it again may output the circuit solution 718 at TP1 to the output database. Note, the interval from time point 752 to time point 754 is depicted as non-zero to denote that a timestep size set by a user or determined by the simulator may be used. This interval may be zero, however. If another resistance value, say 1 Ohm is required, simulator may again store the state of the simulator state at point 754 for later re-use.

The simulator would have now efficiently computed and outputted the circuit responses to Fault 3 with the three different fault values (1000, 100, and 10 Ohms respectively) to the output database. The simulator may then repeat the entire process described for the next fault. For each fault, the method may follow the same approach, as the simulator gradually sweeps the bridge resistance value for that fault over the various bridge resistance values, and the simulator rewinds time and sets the next initial condition for another simulation trajectory.

Once the simulator has simulated all faults at the given test point (e.g., TP1), the simulator may then continue with the fault-free simulation to the next test point (e.g., TP2), if one exists. The simulator may repeat the entire fault injection process and evaluate the corresponding trajectories for each fault resistance value for each test point until the entire simulation is completed.

The single run approach identified above may determine the CPU-expensive fault-free trajectory only once overall, even with multiple bridge resistance values. Further, the simulator may very efficiently calculate the trajectories like 750-752 and 752-754 for most fault locations due to the ease with which Newton-Raphson iterations converge for solutions that are close to the initial solution. Also, the simulation interval from points 754-718 may be shorter overall than the simulation interval from points 752-716, which in turn may be shorter than the simulation interval from points 750-714, resulting in additional time savings. The simulator may select time points 750, 752, and 754 as needed for convergence and efficiency.

Overhead for this embodiment may be minimal since the circuit simulation solutions only need to be stored at a few points for each fault. Memory usage may be extremely minimal since the method may overwrite that same storage location each time the resistance value is changed, i.e., the method may require only a single storage location large enough to hold the circuit simulation solution at a single time point. The embodiment may also minimize disk storage space since only a single copy of the fault-free simulation waveforms may be required, compared to N copies when other methods perform N multiple runs.

At the end of the single-run method, the embodiment may have made all circuit responses at each of the test points available in the output database, for each fault, and for each fault bridge resistance value. Thus it may be possible to compute and output the analog fault coverage (e.g., a determination of what percentage of the overall number of faults has caused a detectable circuit response) on a per-fault-resistance value basis. The detectable circuit response may include one or more voltages or currents, or computed performance measures as previously described. The method may derive and print or display or electronically output for example a graph of coverage versus bridge resistance value via post-simulation processing.

Figure 8:
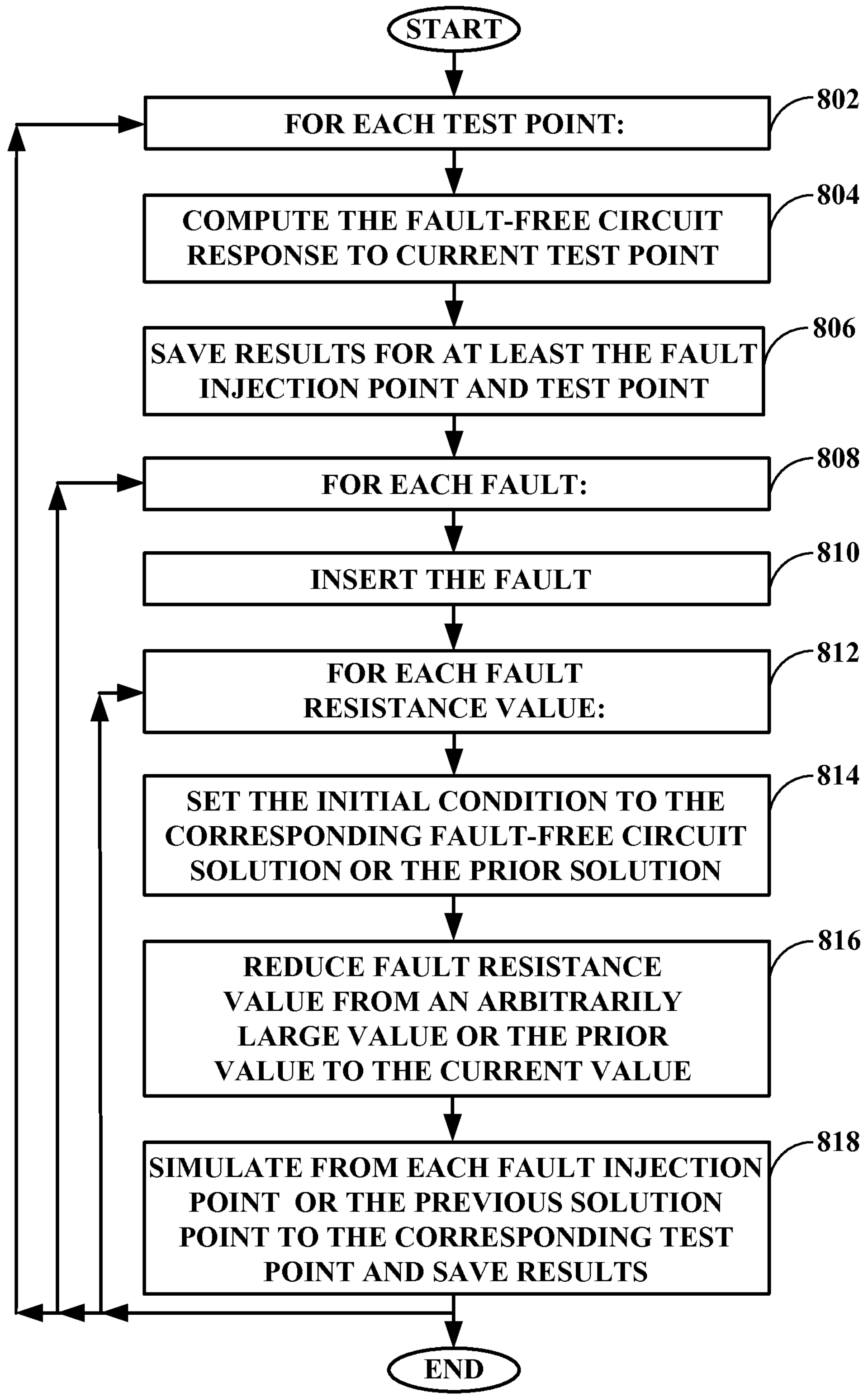
FIG. 8 is a flowchart of an analog fault simulation method, according to the embodiment of FIG. 7.

Referring now to FIG. 8, a flowchart depicting the simulation method according to the embodiment of FIG. 7 is shown. The method may start an outer loop at 802 over all test points to be evaluated. At 804, the simulator may compute the fault-free circuit response from an initial time up to the test point. For the first test point, the initial time may be tstart, while for other test points the initial time may be the previous test point. At 806, the simulator may store the results for at least the current fault injection point and current test point; the simulator may also store intermediate values if specified by a user.

The method may start another loop within the first loop at 808 over all faults to be evaluated. At 810, the simulator inserts the fault to be evaluated into the circuit design. Now, at 812, the method may start a final inner loop over all fault resistance values to be evaluated. At 814 the simulator sets the initial condition for the fault injection point for the test point being evaluated according to the corresponding fault-free circuit solution in the case of a first fault resistance value of this final inner loop, or to the prior simulation results in the case of a subsequent fault resistance value of this final inner loop. In the case of a first fault resistance value of this final inner loop, the simulator may rewind the time to the fault injection point, while for subsequent fault resistance values of this final inner loop, the simulator may rewind the time to that of the prior simulation results. At 816, the simulator may set the fault resistance value by different methods. For the first fault resistance value of this final inner loop, the simulator may set an arbitrarily large resistor value (e.g., 1 GOhm) and then gradually decrease the resistor value to the desired fault resistance value. For subsequent fault resistance values of this final inner loop, the simulator may decrease the prior fault resistance value to the current fault resistance value being evaluated. At 818, the simulator may perform a transient analysis from a rewind point as described above to the corresponding test point, and may store the simulation results.

The method thus may iterate over all test points required, for all faults required, and for each fault resistance value required, in that order. The method may determine fault coverage as previously described, for example by comparing simulation results at each test point with detection thresholds. The method may compute fault coverage immediately following completion of the simulation run or by post-processing results.

Figure 9:
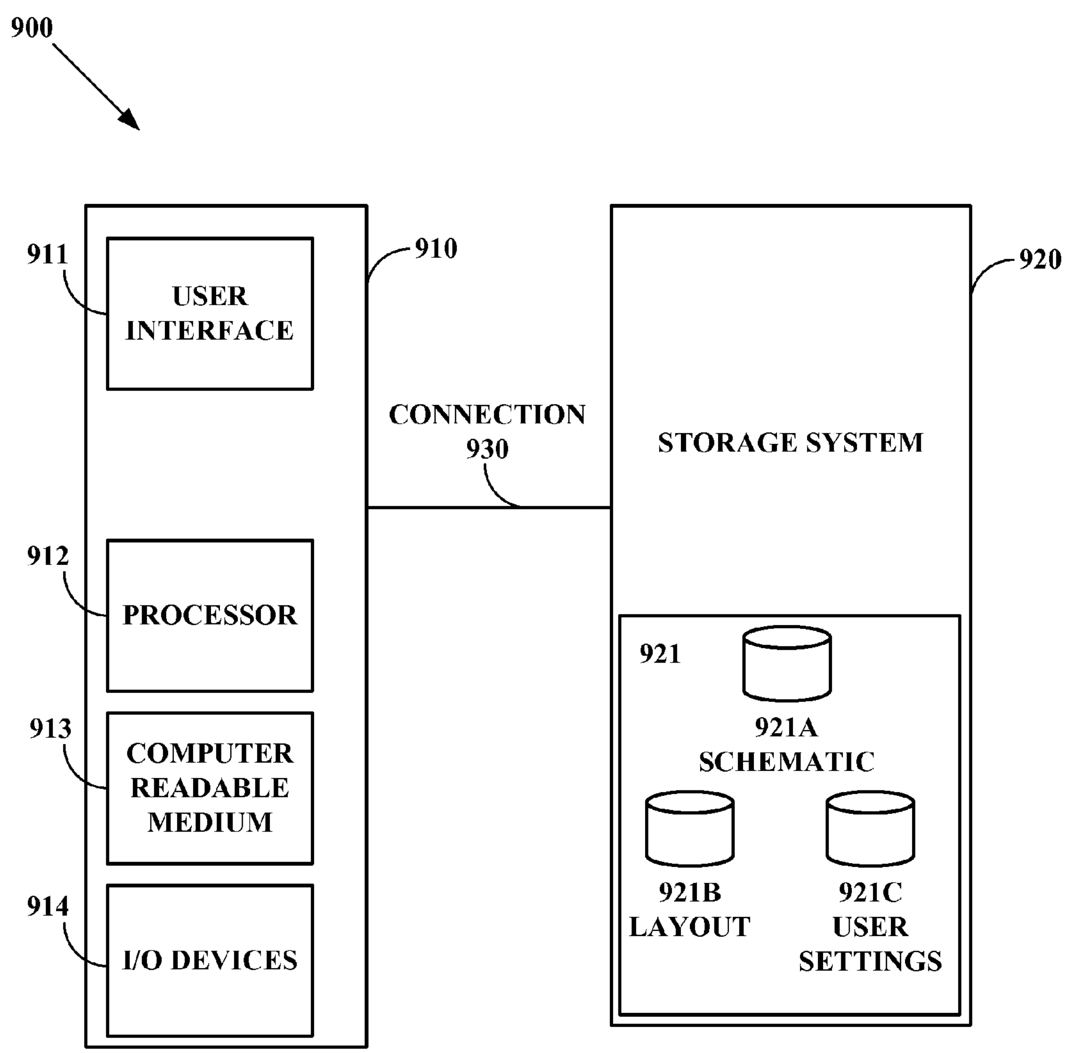
FIG. 9 is a block diagram of an analog fault simulation system according to an embodiment.

Referring now to FIG. 9, a block diagram of an exemplary analog fault simulation system 900 is shown according to an embodiment. This system may provide simulator functionality for any of the methods described above. A user may access the analog fault sensitivity analysis system 900 through a standalone client system, client-server environment, or a network environment. System 900 may comprise one or more clients or servers 910, one or more storage systems 920, and a connection or connections 930 between and among these elements.

Client 910 may execute instructions stored on computer readable medium 913 with processor 912, that provide a user interface 911 that may allow a user to access storage system 920. The instructions may be part of a software program or executable file that may operate electronic design automation (EDA) software. Client 910 may be any computing system, such as a personal computer, workstation, mobile computer, or other device employing a processor which is able to execute programming instructions. User interface 911 may be a GUI run in a user-controlled application window on a display. A user may interact with user interface 911 through one or more input/output (I/O) devices 914 such as a keyboard, a mouse, or a touch screen.

Storage system 920 may take any number of forms, including but not limited to a server with one or more storage devices attached to it, a storage area network, or one or a plurality of non-transitory computer readable media. Databases 921 may be stored in storage system 920 such that they may be persistent, retrieved, or edited by the user. Databases 921 may include a schematic database 921A, a layout database 921B, and a user input database 921C. These databases may be kept as separate files or systems, or may be merged together in any appropriate combination.

Only one client 910 is shown connected to storage system 920 through connection 930, which may be a simple direct wired or wireless connection, a system bus, a network connection, or the like, to provide client 910 with access to storage system 920. In another aspect, connection 930 may enable multiple clients 910 to connect to storage system 920. The connection may be part of a local area network, a wide area network, or another type of network, again providing one or more clients with access to storage system 920. Depending on system administrator settings, client 910's access to system storage 920 or to other clients may be limited.

Figure 10:
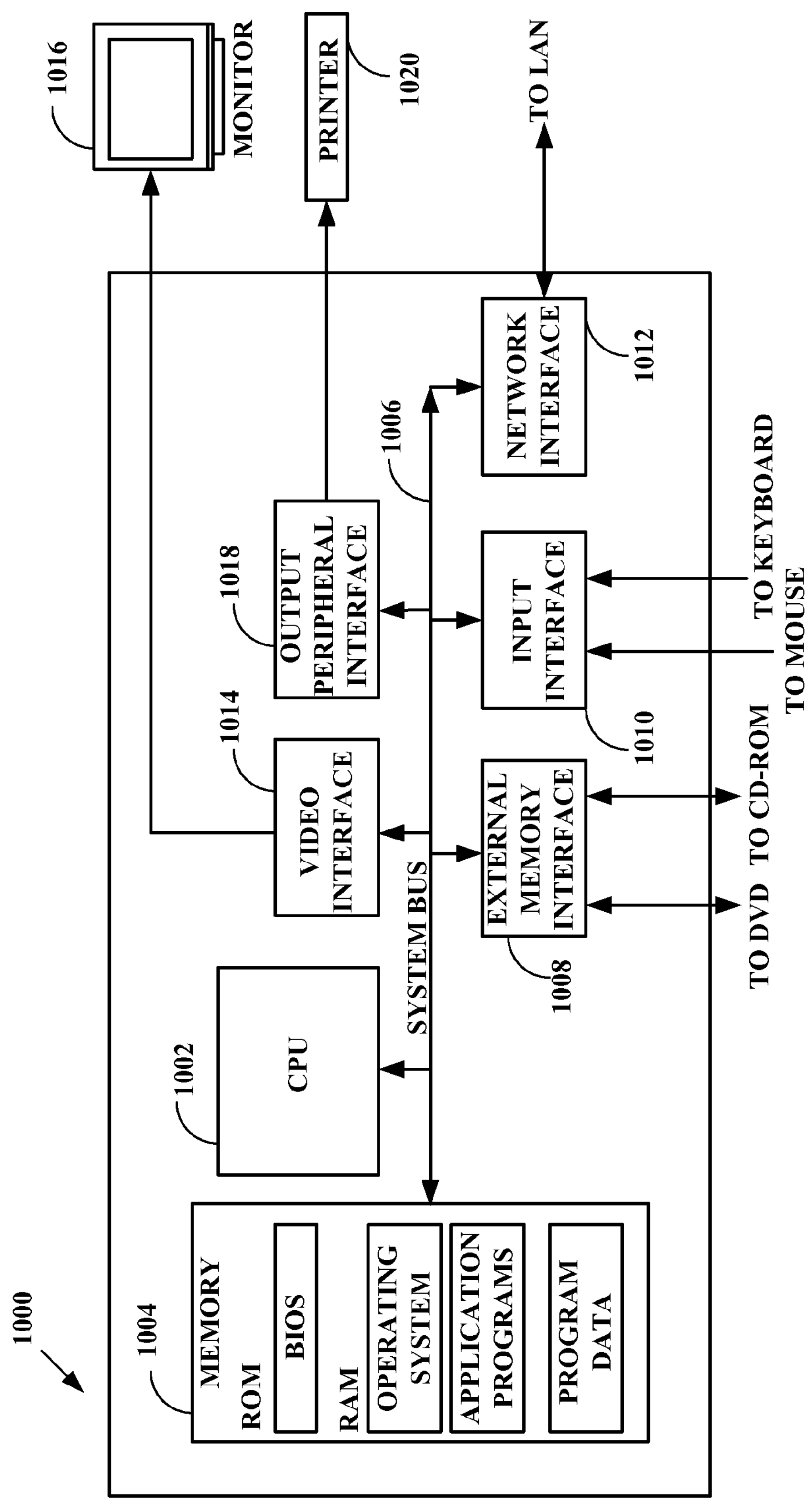
FIG. 10 is a diagram of a computer system according to an embodiment of the present invention.

FIG. 10 depicts a computer system comprising the structure for implementation of the embodiments described above. Computer system 1000 comprises a central processing unit (CPU) 1002 that processes data stored in memory 1004 exchanged via system bus 1006. Memory 1004 typically includes read-only memory, such as a built-in operating system, and random-access memory, which may include an operating system, application programs, and program data. Computer system 1000 also comprises an external memory interface 1008 to exchange data with a DVD or CD-ROM for example. Further, input interface 1010 may serve to receive input from user input devices including but not limited to a keyboard and a mouse. Network interface 1012 may allow external data exchange with a local area network (LAN) or other network, including the internet. Computer system 1000 also typically comprises a video interface 1014 for displaying information to a user via a monitor 1016. An output peripheral interface 1018 may output computational results and other information to output devices including but not limited to a printer 1020.

Computer system 1000 may comprise for example a personal computer or an engineering workstation, each of which is widely known in the art and is commonly used for integrated circuit layout design tasks, along with software products commercially available for performing computer-aided integrated circuit layout design tasks including contact cut placement. Computer system 1000 may also comprise a mobile computer, including for example a tablet computer or a smart phone. The computer system of FIG. 10 may for example receive program instructions, whether from existing software products or from embodiments of the present invention, via a computer program product and/or a network link to an external site.

For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described with reference to operations that may be performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments may serve as the code segments directing a computing device to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While particular embodiments of the present invention have been described, it is to be understood that various different modifications within the scope and spirit of the invention are possible. The invention is limited only by the scope of the appended claims.

What is claimed is:

1. A computer-implemented method comprising:

for a simulation of a circuit design having selectable faults, selectable fault resistance values, and selectable test points:

for each test point, simulating a fault-free circuit design and storing fault-free circuit design simulation results of said simulating;

for each combination of a test point, a fault, and a fault resistance value selected in a nested order:

at a selected test point, inserting an associated selected fault, setting an associated selected fault resistance value in the circuit design, simulating the circuit design with the associated selected fault, and storing faulted circuit design simulation results of said simulating; and using a computer, performing and outputting a fault detection determination based on the fault-free circuit design simulation results and the faulted circuit design simulation results.

2. The method of claim 1 wherein the circuit design is an analog circuit design.

3. The method of claim 1 wherein the simulation is performed in a single transient simulation run.

4. The method of claim 1 wherein the selectable fault resistance values are samples from a statistical distribution.

5. The method of claim 1 wherein the fault-free circuit design simulation results and the faulted circuit design simulation results are stored in at least one of a memory, a disk drive, and a database.

6. The method of claim 1 wherein the fault-free circuit design simulation results include at least results for the test points and corresponding fault injection points that precede the test points by an interval.

7. The method of claim 1 wherein at least one fault injection point is coincident with a corresponding test point.

8. The method of claim 1 wherein at least one fault injection point precedes a corresponding test point by an interval set by one of a user and a simulator.

9. The method of claim 1 wherein the simulating a fault-free circuit design spans an interval from a beginning time point up to the selected test point, wherein for a first test point the beginning time point is a specified simulation start point and is otherwise a corresponding fault injection point that precedes the selected test point.

10. The method of claim 1 wherein for each fault resistance value, an initial fault condition is set, wherein for a first simulation for each selected fault the initial fault condition equals a corresponding simulation result of the fault-free circuit design simulation and otherwise equals the simulation result from the preceding fault resistance value.

11. The method of claim 1 wherein the selectable fault resistance values are simulated in a decreasing order.

12. The method of claim 1 wherein the fault resistance value is reduced during simulation from an initial value to the selected fault resistance value, wherein for a first simulation for the selected fault at the selected test point the initial value equals a large default value and otherwise equals the preceding selected fault resistance value.

13. The method of claim 1 wherein each simulation with faults spans an interval from a beginning time point to a corresponding test point, wherein for a selected fault and a selected test point the beginning time point is a corresponding fault injection point that precedes the selected test point.

14. The method of claim 1 wherein each simulation with faults spans an interval from a beginning time point to a corresponding test point, wherein for a first fault resistance value for a selected fault and a selected test point the beginning time point is a corresponding fault injection point that precedes the selected test point and otherwise is the preceding fault resistance value simulation result time point.

15. The method of claim 1 wherein the fault detection determination further comprises comparing a simulation result with an expected result.

16. The method of claim 1 wherein the fault-free circuit design is input by a user, and at least one of: applied input stimuli, circuit responses of interest, the test points, the faults, the fault resistance values, and fault detection specifications is input by a user.

17. The method of claim 1 wherein the fault detection determination is outputted in at least one of an electronic form, a printed form, and a displayed form.

18. The method of claim 1 wherein the nested order comprises a fault resistance value, a fault, and a test point.

19. The method of claim 1 wherein the nested order comprises a fault resistance value, a test point, and a fault.

20. The method of claim 1 wherein the nested order comprises a test point, a fault, and a fault resistance value.

21. The method of claim 1 wherein the fault detection determination further comprises a comparison of at least one simulated circuit performance quantity with at least one of a threshold value and a second simulated circuit performance quantity from a different simulation.

22. The method of claim 21 wherein the threshold value comprises at least one of a frequency threshold, a frequency range, a voltage threshold, a voltage range, a current threshold, and a current range.

23. A non-transitory computer readable medium storing instructions that, when executed by a processor, cause the processor to perform a method comprising:

for a simulation of a circuit design having selectable faults, selectable fault resistance values, and selectable test points:

for each test point, simulating a fault-free circuit design and storing fault-free circuit design simulation results of said simulating;

for each combination of a test point, a fault, and a fault resistance value selected in a nested order:

at a selected test point, inserting an associated selected fault, setting an associated selected fault resistance value the circuit design, simulating the circuit design with the associated selected fault, and storing faulted circuit design simulation results of said simulating; and performing and outputting a fault detection determination based on the fault-free circuit design simulation results and the faulted circuit design simulation results.

24. The medium of claim 23 wherein the selectable fault resistance values are samples from a statistical distribution.

25. The medium of claim 23 wherein the nested order comprises a fault resistance value, a fault, and a test point.

26. The medium of claim 23 wherein the nested order comprises a fault resistance value, a test point, and a fault.

27. The medium of claim 23 wherein the nested order comprises a test point, a fault, and a fault resistance value.

28. A system comprising:

a non-transitory computer-readable medium to store a circuit design;

a processor executing instructions to:

for a simulation of a circuit design having selectable faults, selectable fault resistance values, and selectable test points:

for each test point, simulate a fault-free circuit design and store fault-free circuit design simulation results of simulating said fault-free circuit design;

for each combination of a test point, a fault, and a fault resistance value selected in a nested order:

at a selected test point, insert an associated selected fault, set an associated selected fault resistance value the circuit design, simulate the circuit design with the associated selected fault, and store faulted circuit design simulation results of simulating the circuit design with the associated selected fault; and perform and output a fault detection determination based on the fault-free circuit design simulation results and the faulted circuit design simulation results.

29. The system of claim 28 wherein the selectable fault resistance values are samples from a statistical distribution.

30. The system of claim 28 wherein the nested order comprises a fault resistance value, a fault, and a test point.

31. The system of claim 28 wherein the nested order comprises a fault resistance value, a test point, and a fault.

32. The system of claim 28 wherein the nested order comprises a test point, a fault, and a fault resistance value.

* * * * *

UNITED STATES PATENT AND TRADEMARK OFFICE

CERTIFICATE OF CORRECTION

PATENT NO. : 8,863,050 B1
APPLICATION NO. : 13/843139
DATED : October 14, 2014
INVENTOR(S) : Donald J. O'Riordan and Victor Zhuk It is certified that error appears in the above-identified patent and that said Letters Patent is hereby corrected as shown below:

In the Claims

Col. 12, line 60, claim 23, after "value", insert --in--;

Col. 14, line 3, claim 28, after "value", insert --in--.

Signed and Sealed this
Seventeenth Day of February, 2015

Michelle K. Lee
*Deputy Director of the United States Patent and Trademark Office*